(12) United States Patent
Hu

(10) Patent No.: US 10,349,185 B2
(45) Date of Patent: Jul. 9, 2019

(54) MEMS MICROPHONE

(71) Applicant: CSMC TECHNOLOGIES FAB2 CO., LTD., Wuxi New District (CN)

(72) Inventor: Yonggang Hu, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 15/573,235

(22) PCT Filed: May 5, 2016

(86) PCT No.: PCT/CN2016/081062
§ 371 (c)(1),
(2) Date: Nov. 10, 2017

(87) PCT Pub. No.: WO2016/180262
PCT Pub. Date: Nov. 17, 2016

(65) Prior Publication Data
US 2018/0139544 A1 May 17, 2018

(30) Foreign Application Priority Data
May 13, 2015 (CN) .......................... 2015 1 0244099

(51) Int. Cl.
| | |
|---|---|
| H04R 19/04 | (2006.01) |
| H04R 1/08 | (2006.01) |
| B81B 3/00 | (2006.01) |
| H04R 7/06 | (2006.01) |
| H04R 7/18 | (2006.01) |
| H04R 19/00 | (2006.01) |

(52) U.S. Cl.
CPC ........... *H04R 19/04* (2013.01); *B81B 3/0086* (2013.01); *H04R 7/06* (2013.01); *H04R 7/18* (2013.01);
(Continued)

(58) Field of Classification Search
CPC ........ H04R 19/04; H04R 19/005; H04R 1/08; H04R 9/08; H04R 11/04; H04R 17/02; H04R 21/02
(Continued)

(56) References Cited

U.S. PATENT DOCUMENTS

| | | | |
|---|---|---|---|
| 5,146,435 A | 9/1992 | Bernstein | |
| 6,812,620 B2 * | 11/2004 | Scheeper | ............... H04R 19/04 |
| | | | 310/324 |

(Continued)

FOREIGN PATENT DOCUMENTS

| | | |
|---|---|---|
| CN | 101189910 A | 5/2008 |
| CN | 102415108 A | 4/2012 |

(Continued)

OTHER PUBLICATIONS

European Search Report for European Counterpart Application No. 16792112.1, dated Sep. 17, 2018 (8 pages).

(Continued)

*Primary Examiner* — Suhan Ni
(74) *Attorney, Agent, or Firm* — Kagan Binder, PLLC

(57) ABSTRACT

An MEMS microphone comprises a substrate (100), a support portion (200), a superimposed layer (600), an upper plate (300) and a lower plate (400). The substrate (100) is provided with an opening (120) penetrating the middle thereof; the lower plate (400) is arranged above and spanning the substrate (100); the support portion (200) is fixed on the lower plate (400); the upper plate (300) is attached on the support portion (200); an accommodation cavity (500) is formed from the support portion (200), the upper plate (300) and the lower plate (400); the superimposed layer (600) is attached on an central region of the upper plate (300) or the lower plate (400), and insulation is achieved between the upper plate (300) and a lower plate (400).

18 Claims, 6 Drawing Sheets

(52) U.S. Cl.
CPC .... *H04R 19/005* (2013.01); *B81B 2201/0257* (2013.01); *B81B 2203/0127* (2013.01); *B81B 2203/0315* (2013.01); *B81B 2203/04* (2013.01); *H04R 2201/003* (2013.01)

(58) Field of Classification Search
USPC .................................................. 381/174–176
See application file for complete search history.

(56) References Cited

U.S. PATENT DOCUMENTS

| | | | |
|---|---|---|---|
| 7,466,834 B2 * | 12/2008 | Ogura | .................. B81B 7/0061 381/174 |
| 2007/0058825 A1 | 3/2007 | Suzuki et al. | |
| 2007/0189558 A1 | 8/2007 | Ogura et al. | |
| 2015/0060955 A1 | 3/2015 | Chen | |

FOREIGN PATENT DOCUMENTS

| | | | |
|---|---|---|---|
| CN | 103731783 A | 4/2014 |
| CN | 104105040 A | 10/2014 |
| CN | 204046819 U | 12/2014 |
| CN | 204231667 U | 3/2015 |

OTHER PUBLICATIONS

Chinese Office Action for Chinese Counterpart Application No. 201510244099, dated Jul. 20, 2018 (8 pages).
International Search Report and English Translation thereof for International Application No. PCT/CN2016/081062, dated Jul. 21, 2016 (5 pages).

* cited by examiner

MEMS MICROPHONE

FIELD OF THE INVENTION

The present disclosure relates to a technical field of semiconductor devices, and more particular relates to a micro-electro-mechanical system (MEMS) microphone.

BACKGROUND OF THE INVENTION

MEMS microphone chips can currently be divided into piezo-resistive type, piezo-electric type, and capacitive type, among which the capacitive MEMS microphone has the widest range of applications. The capacitive MEMS microphone possesses the following advantages: small size, high sensitivity, good frequency characteristic, low noise, and wide working temperature range.

The capacitive MEMS microphone is generally consisted of a back plate and a diaphragm. The diaphragm has a certain flexibility and can be vibrated by virtue of air. The back plate has certain rigidity and fully defines a plurality of holes which are so called acoustic holes. Air can pass through the plurality of acoustic holes to enable the diaphragm to vibrate, while the back plate will not vibrate along with the diaphragm. The back plate and the diaphragm cooperatively form a plate capacitor, the sound drives the flexible diaphragm to vibrate by the air, thereby changing the capacitance value of the plate capacitor. The change of the capacitance value generates a detectable electrical signal for the peripheral circuit, thereby enabling the conversion from the sound signal to the electrical signal. Sensitivity is an important indicator to evaluate the capacitive MEMS microphone. The sensitivity of the silicon-based microphone is determined by the size of the diaphragm, the extent of deformation and the shape of the deformation. At present, if other design structures remain unchanged, the sensitivity of the capacitive MEMS microphone will inevitably be reduced if the chip area is to be reduced.

SUMMARY OF THE INVENTION

Accordingly, it is necessary to provide a capacitive MEMS microphone which can improve the sensitivity without reducing the chip area.

A MEMS microphone includes: a substrate defining an opening extending through a middle portion thereof; a lower polar plate spanning the opening; a supporting portion fixed to the lower polar plate; an upper polar plate attached to the supporting portion; and a superimposed layer attached to a central region of the upper polar plate or the lower polar plate; wherein the supporting portion, the upper polar plate, and the lower polar plate cooperatively form an accommodating cavity, the upper polar plate is insulated from the lower polar plate.

The above MEMS microphone includes the superimposed layer, which is attached to the central region of the upper polar plate or the lower polar plate serving as a diaphragm, thus increasing the thickness of the middle portion of the diaphragm, which can effectively limit the deformation of the central region of the diaphragm. When the diaphragm moves due to the vibration, the central region of the diaphragm is flatter than that of the conventional structure microphone. In the case that the diaphragm moves by the same distance, a capacitance structure with a relatively flatter diaphragm central region clearly has a greater capacitance, i.e., the amount of the capacitance becomes greater, such that the sensitivity is increased.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rather, these embodiments are provided so that this disclosure will be thorough and complete.

Unless otherwise defined, the technical and scientific terms used herein have the same meaning to the understanding of a person skilled in the art where the present invention pertains. The terms used in the specification of the present invention is for the purpose of describing the embodiments of the present invention, as opposed to limiting thereto. The language "and/or" used in the disclosure refers to any and all combinations of the one or multiple items listed.

The embodiment of the invention will be specifically illustrated with reference to the following description.

Figure 1:
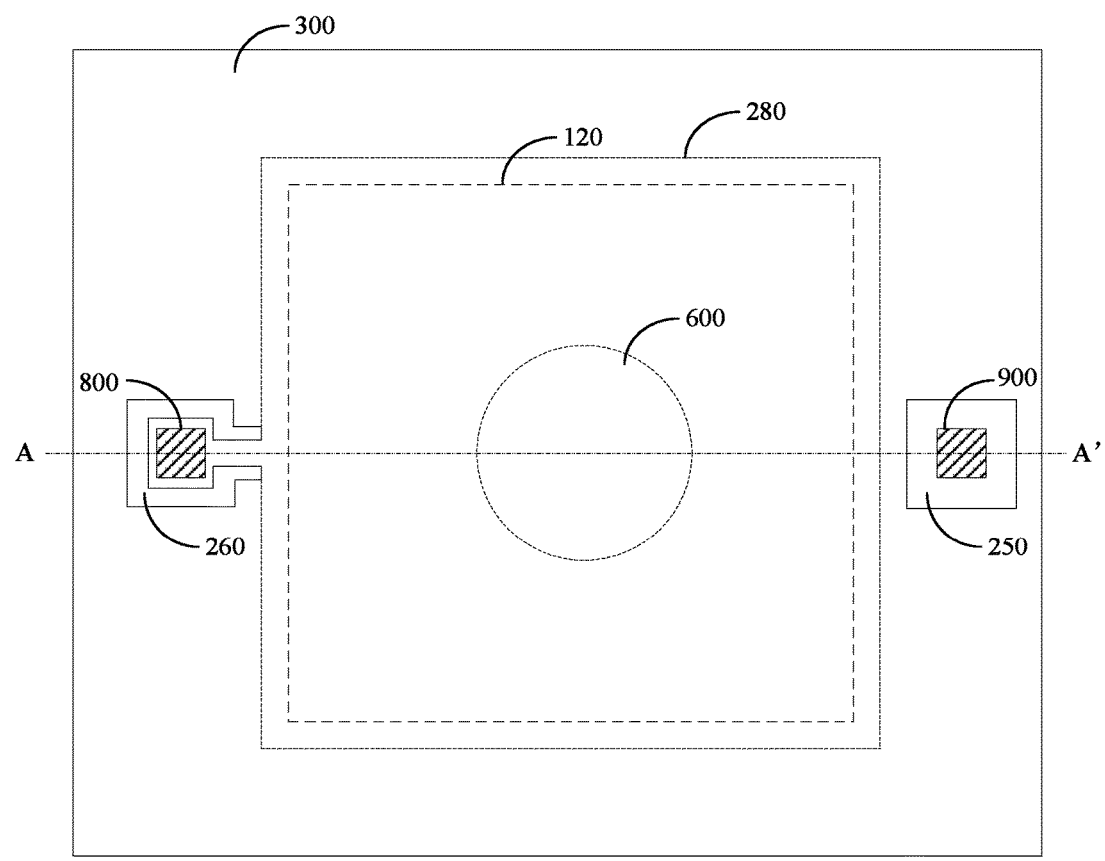
FIG. 1 is a top view of an MEMS microphone according to an embodiment.
Figure 2:
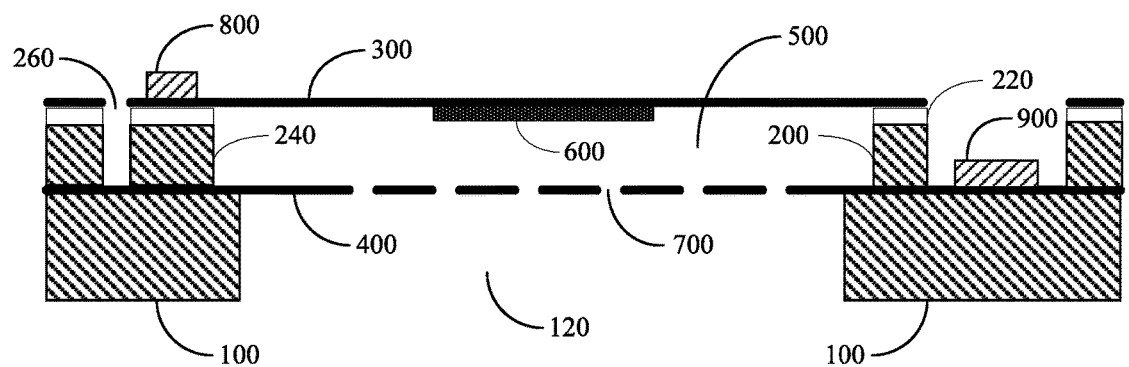
FIG. 2 is a cross-sectional view taken along line A-A' of FIG. 1.

FIG. 1 is a top view of a MEMS microphone according to an embodiment, FIG. 2 is a cross-sectional view taken along line A-A' of FIG. 1.

A MEMS microphone includes a substrate 100, a supporting portion 200, an upper polar plate 300, a lower polar plate 400, and a superimposed layer 600. In the illustrated embodiment, the substrate 100 is made of silicon. Alternatively, the substrate 100 can also be made of other semiconductors or compounds of semiconductors, such as one of Ge, SiGe, SiC, $SiO_2$, and $Si_3N_4$. The substrate can also be provided with a second insulating layer, the lower polar plate 400 spans the second insulating layer. The second insulating layer is configured to insulate the substrate 100 from the lower polar plate 400.

The substrate 100 defines an opening 120 extending through a middle thereof, the lower polar plate 400 spans the opening 120. The supporting portion 200 is fixed on the lower polar plate 400, the upper polar plate 300 is attached to the supporting portion 200. The supporting portion 200, the upper polar plate 300, and the lower polar plate 400 cooperatively form an accommodating cavity 500. The superimposed layer 600 is attached to a central region of the upper polar plate 300 or the lower polar plate 400, the upper polar plate 300 is insulated from the lower polar plate 400.

The superimposed layer 600 can be made of at least one selected from the group consisting of polysilicon, silicon nitride, alpha silicon, and metal (for example Al, W, and Ti). Of course, the superimposed layer 600 can be made of the same material as that of the upper polar plate 300 or the lower polar plate 400, or the superimposed layer 600 can even be integrally formed with the upper polar plate 300 or the lower polar plate 400. The superimposed layer 600 may has the same thickness as that of the upper polar plate 300 or the lower polar plate 400, thus resulting the increasing of the thickness of the diaphragm. In the illustrated embodiment, the shape of the superimposed layer 600 is circular. In alternative embodiments, the superimposed layer 600 can also be shaped as an ellipse or a polygon, such as a square, a regular hexagon, a regular octagon, and the like, and it can also have an irregular shape.

In the illustrated embodiment shown in FIG. 1 and FIG. 2, the superimposed layer 600 is attached to a side of the upper polar plate 300 facing to the accommodating cavity 500, then the upper polar plate 300 serves as a diaphragm and the lower polar plate 400 serves as a back plate. In some embodiments, the superimposed layer 600 can also be attached to a side of the upper polar plate 300 away from the accommodating cavity 500.

Figure 3:
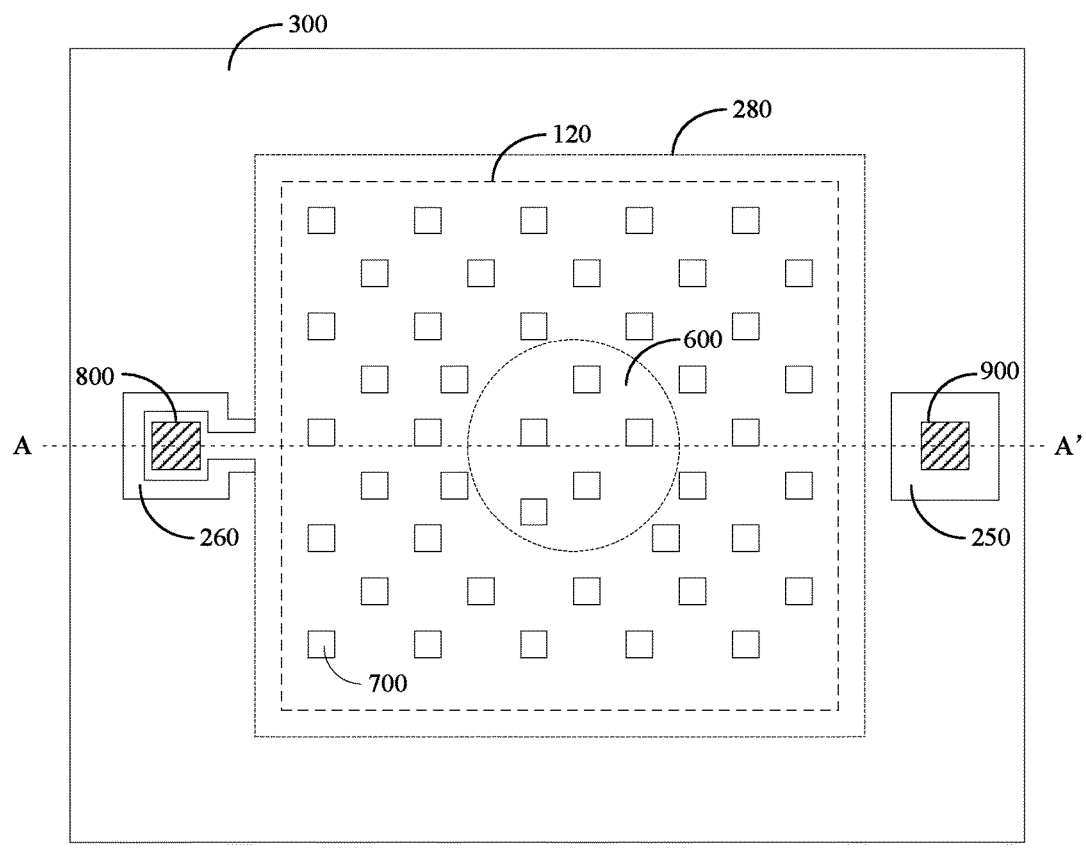
FIG. 3 is a top view of an MEMS microphone according to another embodiment.
Figure 4:
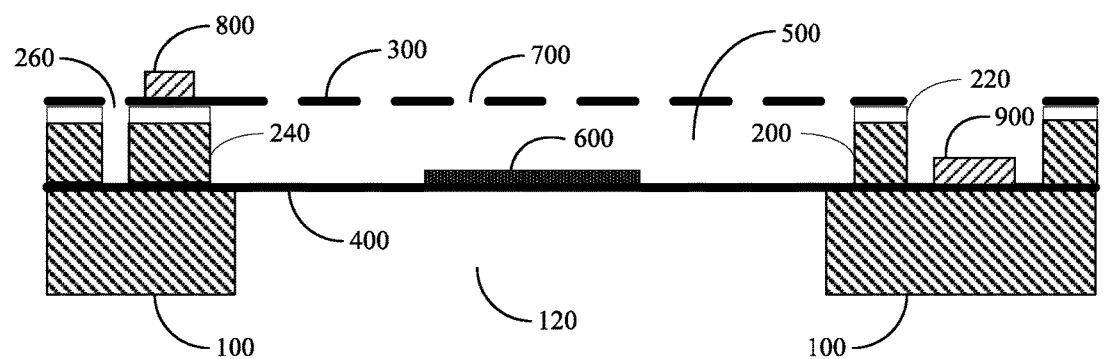
FIG. 4 is a cross-sectional view taken along line A-A' of FIG. 3.

FIG. 3 is a top view of an MEMS microphone according to another embodiment, FIG. 4 is a cross-sectional view taken along line A-A' of FIG. 3. In the embodiment shown in FIG. 3 and FIG. 4, the superimposed layer 600 is attached to a side of the lower polar plate 400 facing to the accommodating cavity 500, then the upper polar plate 300 serves as a back plate and the lower polar plate 400 serves as a diaphragm. In some embodiments, the superimposed layer 600 can also be attached to a side of the lower polar plate 400 away from the accommodating cavity 500.

As shown in FIG. 1 and FIG. 2, when the upper polar plate 300 serves as a diaphragm and the lower polar plate 400 serves as a back plate, the upper polar plate 300 is a flexible film, the lower polar plate 400 is a rigid film. As shown in FIG. 3 and FIG. 4, when the upper polar plate 300 serves as a back plate and the lower polar plate 400 serves as a diaphragm, the upper polar plate 300 is a rigid film, the lower polar plate 400 is a flexible film. The rigid film is not susceptible to acoustic vibration and is not likely to be deformed, the flexible film is susceptible to acoustic vibration and is likely to be deformed. The upper polar plate 300 or the lower polar plate 400 which serves as the diaphragm is provided with a plurality of uniformly distributed acoustic holes 700. Of course, the acoustic holes 700 can also be non-uniformly distributed, for example, the acoustic holes 700 are more densely distributed on the central region of the upper polar plate 300 or the lower polar plate 400. The flexible film is made of one selected from the group consisting of Si, Ge, SiGe, and SiC, or Al, W and Ti, or nitrides of Al, W and Ti. Both of the upper polar plate 300 and the lower polar plate 400 include a conductive layer. The upper polar plate 300 and the lower polar plate 400 can be made of a conductive material as a whole, or they can also be of a composite layer structure including a conductive layer.

The supporting portion 200, the upper polar plate 300, and the lower polar plate 400 cooperatively form the accommodating cavity 500, which is actually formed by removing a sacrificial layer. In the removing process, the sacrificial layer is etched to form a cavity (the accommodating cavity 500).

The supporting portion 200 includes a first insulating layer 220. The presence of the first insulating layer 220 enables the upper polar plate 300 to be insulated from the lower polar plate 400. The supporting portion 200 can be entirely made of insulation material, or it can also be a composite layer structure including an insulation layer. In the embodiment, the supporting portion 200 has a square frame structure and defines an opening 280 extending through the center thereof. The opening 280 of the supporting portion 200 is a slightly bigger than the opening 120 of the substrate 100, as shown in FIG. 1 and FIG. 3. The supporting portion 200 includes a supporting post 240, which is independent from the square frame-shaped structure main body of the supporting portion 200. A gap (space) 260 is formed between the supporting post 240 and the square frame-shaped structure main body. The supporting post 240 is mainly employed to mount an upper electrode 800, and the gap 260 serves to isolate the electrode 800 from the square frame structural main body of the supporting portion 200, thereby enabling the electrode 800 to be isolated from the upper polar plate 300 with a relatively larger area on the square frame structural main body of the supporting portion 200, thus reducing an influence of a parasitic capacitance. The supporting portion 200 further defines a notch 250 configured to expose the lower polar plate 400 for fabricating a lower electrode 900. In the illustrated embodiment, the notch 250 has a through hole structure. In an alternative embodiment, the notch 250 can also be a notch on an edge of the supporting portion 200.

In alternative embodiments, a main body of the supporting portion 200 may be of other polygon frame-shaped structures, such as a regular hexagon frame-shaped structure, a regular octagon frame-shaped structure, or a circular structure.

The MEMS microphone further includes the upper electrode 800 and the lower electrode 900. The upper electrode 800 and the lower electrode 900 are made of one of the P-type silicon (for example, silicon doped with boron impurity) and the N-type silicon (for example, silicon doped with phosphorus impurity). The upper electrode 800 is positioned on the upper polar plate 300 on the supporting post 240 and is electrically coupled to the upper polar plate 300. The lower electrode 900 is positioned in the notch 250 of the supporting portion 200 and is electrically coupled to the lower polar plate 400.

At last, it should be noted that, the substrate 100 represents a supporting structure for providing a support, and it does not necessarily mean that the substrate 100 is a separate component. The substrate 100 can represent a multilayer structure, which can be formed by technologies such as epitaxy, deposition, and bonding.

It should be understood that drawings of FIG. 1 through FIG. 4 simply exemplify some main structures of the device, and does not represent all of the structures of the device.

Figure 5A:
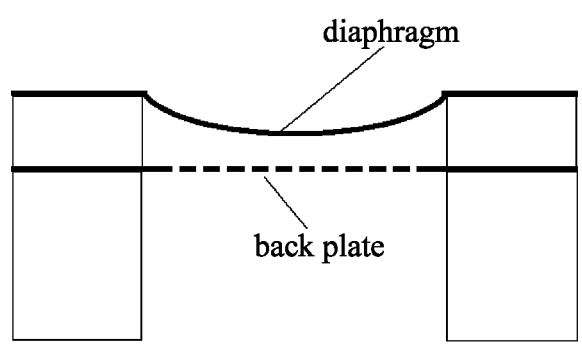
FIG. 5A is a schematic diagram of a conventional MEMS microphone in a vibrating state.
Figure 5B:
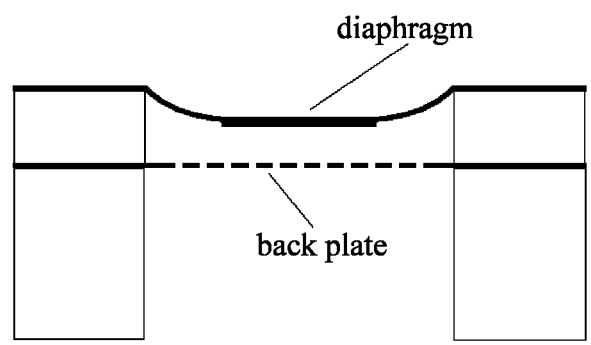
FIG. 5B is a schematic diagram of a MEMS microphone with a superimposed layer in a vibrating state.

The above MEMS microphone includes the superimposed layer, which is attached to the central region of the upper polar plate or the central region of the lower polar plate serving as a diaphragm, thus increasing the thickness of the middle portion of the diaphragm, which can effectively limit the deformation of the central region of the diaphragm. FIG. 5A and FIG. 5B are cross-sectional views of a conventional MEMS microphone and a MEMS microphone with superimposed layer in a vibrating state, respectively. As can be seen from the two figures that, when the diaphragm moves due to the vibration, the central region of the diaphragm is flatter than that of the conventional structure microphone. In the case that the diaphragm moves by the same distance, a capacitance structure with a relatively flatter diaphragm central region clearly has a greater capacitance, i.e., the amount of change of the capacitance becomes greater, such that the sensitivity is increased.

The above are several embodiments of the present invention described in detail, and should not be deemed as limitations to the scope of the present invention. It should be noted that variations and improvements will become apparent to those skilled in the art to which the present invention pertains without departing from its spirit and scope. Therefore, the scope of the present invention is defined by the appended claims.

What is claimed is:

1. A MEMS microphone, comprising:
a substrate defining an opening extending through a middle portion thereof;
a lower polar plate spanning the opening, wherein the lower polar plate is a back plate;
a supporting portion fixed to the lower polar plate, wherein the supporting portion comprises a supporting post independent from a main body of the supporting portion;
an upper polar plate attached to the supporting portion, wherein the upper polar plate is a diaphragm having a thickness;
an upper electrode electrically coupled to the upper polar plate and a lower electrode electrically coupled to the lower polar plate; and
a superimposed layer attached to a central region of the upper polar plate, wherein the superimposed layer when attached to the central region acts to increase the thickness of the diaphragm and to limit the deformation of the central region when the upper polar plate is caused to vibrate such that the upper polar plate attached to the superimposed layer remains flatter during vibration;
wherein the supporting portion, the upper polar plate, and the lower polar plate, cooperatively form an accommodating cavity, the upper polar plate is insulated from the lower polar plate,
wherein the supporting post is employed to mount the upper electrode,
wherein a gap is formed between the supporting post and the main body, and
wherein the gap isolates a portion of the upper polar plate attached to the main body of the supporting portion from another portion of the upper polar plate attached to the supporting post of the supporting portion, thereby isolating the upper electrode from the portion of the upper polar plate attached to the main body of the supporting portion.

2. The MEMS microphone according to claim 1, wherein the diaphragm is a flexible film, and wherein the back plate is a rigid film.

3. The MEMS microphone according to claim 1, wherein the superimposed layer is attached to a side of the upper polar plate facing the accommodating cavity.

4. The MEMS microphone according to claim 1, wherein the superimposed layer is made of at least one selected from the group consisting of polysilicon, silicon nitride, alpha silicon, and metal.

5. The MEMS microphone according to claim 1, wherein the superimposed layer has a shape selected from the group consisting of circular, ellipse, and polygon.

6. The MEMS microphone according to claim 1 wherein the lower polar plate defines a plurality of acoustic holes, wherein the acoustic holes are more densely distributed on a central region of the lower polar plate.

7. The MEMS microphone according to claim 1, wherein both of the upper polar plate and the lower polar plate comprise a conductive layer.

8. The MEMS microphone according to claim 1, wherein the supporting portion comprises a first insulating layer configured to insulate the upper polar plate from the lower polar plate.

9. The MEMS microphone according to claim 1, wherein the main body of the supporting portion has a shape selected from the group consisting of annular ring and polygon ring.

10. The MEMS microphone according to claim 1, wherein the upper electrode and the lower electrode are made of one selected from the group consisting of P-type silicon and N-type silicon.

11. The MEMS microphone according to claim 1, wherein the supporting portion further defines a notch having a through hole structure, wherein the notch is configured to expose the lower polar plate below the supporting portion, and wherein the lower electrode is positioned in the notch of the supporting portion.

12. The MEMS microphone according to claim 1, wherein the substrate is provided with a second insulating layer, the lower polar plate spans the second insulating layer and is configured to insulate the substrate from the lower polar plate.

13. The MEMS microphone according to claim 1, wherein the substrate is made of semiconductor.

14. The MEMS microphone according to claim 1, wherein the superimposed layer is attached to the central region of the upper polar plate such that for a distance moved during vibration, a capacitance between the upper polar plate and the lower polar plate is increased.

15. The MEMS microphone according to claim 14, wherein a sensitivity of the MEMS microphone is also increased, corresponding to the increase in the capacitance between the upper polar plate and the lower polar plate.

16. The MEMS microphone according to claim 1, wherein the upper polar plate is flexible and can be vibrated by virtue of air.

17. The MEMS microphone according to claim 16, wherein the lower polar plate does not vibrate along with the upper polar plate.

18. The MEMS microphone according to claim 1, wherein the superimposed layer is attached to a side of the upper polar plate facing away from the accommodating cavity.

* * * * *